(12) United States Patent
Shoyama (10) Patent No.: US 6,457,166 B1
(45) Date of Patent: Sep. 24, 2002

(54) CONSTRAINT GENERATING DEVICE FOR LOGIC SYNTHESIS AND ITS CONSTRAINT GENERATING METHOD

(75) Inventor: Hideki Shoyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/492,165

(22) Filed: Jan. 27, 2000

(30) Foreign Application Priority Data

Jan. 25, 1999 (JP) .......................................... 11-015744

(51) Int. Cl.⁷ .............................................. G06F 17/50
(52) U.S. Cl. ................................ 716/18; 716/2; 716/3; 716/4; 716/5; 716/6; 716/7; 716/8; 326/37; 364/488
(58) Field of Search ...................... 716/18, 6–8, 2–5; 326/37–38, 93; 364/488–91

(56) References Cited

U.S. PATENT DOCUMENTS

| 5,721,690 A | * | 2/1998 | Asaka ......................... 364/489 |
| 5,812,416 A | * | 9/1998 | Gupte et al. ................. 364/490 |
| 5,883,808 A | | 3/1999 | Kawarabayashi ........... 364/488 |
| 6,295,636 B1 | * | 9/2001 | Dupenloup ................... 716/18 |

FOREIGN PATENT DOCUMENTS

| DE | 100-03-101.3-53 | 2/2000 |
| JP | 6-266801 | 9/1994 |
| JP | 9-212533 | 8/1997 |
| JP | 10-214280 | 8/1998 |

OTHER PUBLICATIONS

R. Beckmann et al. "Using constraint logic programming in Memory Synthesis for general purpose comperters" European Design and Test Conf. 1997 ED&TC 97 proceedings pg. 619.*

R. Aggrawal et al. "Speeding up technology independent timing optiimization by network partioning" Computer aided design 1997 Digest of Papers IEEE/ACM pg. 83–90.*

M. Chatterjee et al. "LOT: logig optimization with testability—New transformations for logic synthesis" IEEE transactions on computer adided design of integrated citcuits and systems 5/98. p. 386–400.*

* cited by examiner

Primary Examiner—Vuthe Siek
Assistant Examiner—Granville Lee
(74) Attorney, Agent, or Firm—Foley & Lardner (57) ABSTRACT

A logic synthesis constraint generating method for generating a delay constraint for a logical circuit having a hierarchical structure of blocks, comprises a step of receiving information of a logical circuit including the hierarchical structure divided by the block, an internal delay of each block, and a delay between the blocks, a delay distributing constraint of the logical circuit, and the target library information of the logical circuit; a step of storing the received information of the logical circuit, delay distributing constraint of the logical circuit, and target library information of the logical circuit; a step of performing a timing analysis on the information of the logical circuit and the delay distributing constraint of the logical circuit stored in the circuit database process; and a step of, when distributing the delay distributing constraint of the logical circuit as a logic synthesis delay constraint, receiving the ratio of each delay at a lower hierarchy excepting the delay of a circuit to be optimized for logic synthesis, and distributing the value obtained by subtracting the delay of the circuit to be synthesized logically from a constraint of a path according to the ratio of the delay of the lower hierarchy to each hierarchy as the logic synthesis delay constraint.

20 Claims, 5 Drawing Sheets

CONSTRAINT GENERATING DEVICE FOR LOGIC SYNTHESIS AND ITS CONSTRAINT GENERATING METHOD

BACKGROUNDS OF THE INVENTION

1. Field of the Invention

The present invention relates to an optimization technique for a logical circuit, and more particularly to a constraint generating device for logic synthesis which generates a delay constraint for a logical circuit having a hierarchical structure of blocks and its constraint generating method.

2. Description of the Related Art

There is a logic synthesis method disclosed in, for example, Japanese Patent Publication Laid-Open (Kokai) No. Heisei 6-266801, as the conventional technique of deciding a schematic wiring path between blocks based on a floor plan, setting a constraint at a logic synthesis according to the wiring length of a net, and executing the logic synthesis according to the set constraint.

The conventional logic synthesis method will be describe below. In the logic synthesis method, a floor plan on a logical circuit is created according to the specification of function level of a logical circuit to be synthesized logically, the wiring length of a net across blocks forming a logical circuit according to the created floor plan is estimated, and constraint information at a logic synthesis is set according to the estimated wiring length. A gate of high driving potential is generated by the first logic synthesis at the output gate of a long net across blocks, in consideration of the set constraint information. The floor plan contains location of blocks, wiring between blocks, and computation of wiring length between blocks.

In delay distribution processing, after requiring the wiring length, the delay value of a net in every block is compared with a predetermined limited value, and as for a net having the wiring length beyond the limited value or a net that is not beyond the limited value but less flexible, a logic synthesis delay constraint to the effect that the logic synthesis is performed by use of a gate of high driving potential as the output gate of the net, is generated and stored.

Figure 5:
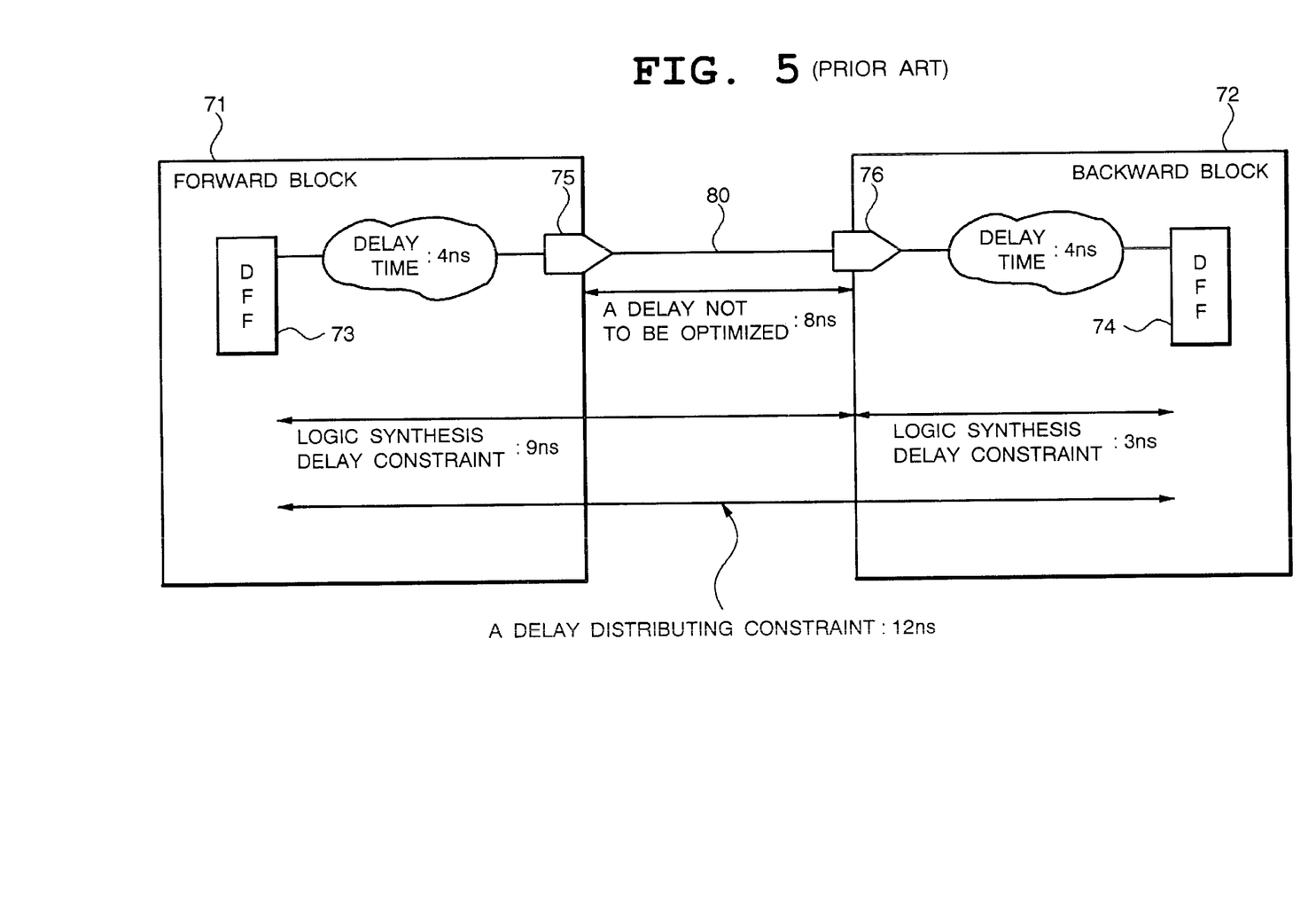
FIG. 5 is a view for use in describing an example of the conventional logic synthesis delay constraint distributing method.

The conventional technique will be described in detail with reference to FIG. 5. FIG. 5 shows a path going from a DFF 73 within a forward block 71 to a DFF 74 within a backward block 72 through a net 80 having a delay not to be optimized, and an example of generating a logic synthesis delay constraint in the conventional technique when the clock cycle for driving the DFF 73 and the DFF 74 that may be constraint for delay distribution of the path is 12 ns.

Since the conventional technique decides the driving potential of the output gate 75 depending on the wiring length of the net 80 that is of a delay not to be optimized, a logic synthesis delay constraint is generated assuming that the wiring delay of the net 80 not to be optimized is included in the delay of the forward block 71.

Namely, the whole delay of the forward block 71 is the total of the delay from the DFF 73 to the upstream before the input gate 76 of the backward block 72.

Next, an example of distributing a delay distributing constraint to the forward block 71 and the backward block 72 by the ratio of each delay required in the forward block 71 and the backward block 72 is shown.

When the respective internal delays of the forward block 71 and the backward block 72 are both 4 ns and the delay of the net 80 is 8 ns, the delay of the forward block 71 becomes 12 (=4+8) ns. Since the delay distributing constraint 12 ns of the whole path is respectively divided in the forward block 71 and the backward block 72 by the ratio of the respective delays; 12:4=3:1, the forward block 71 is provided with 9 ns as a logic synthesis delay constraint and the backward block 72 is provided with 3 ns as a logic synthesis delay constraint.

Because the wiring length of the net 80 is very long, there may be the case where a path doesn't satisfy a delay constraint even if specifying the delay constraint to the effect that the driving potential of the output gate 75 in the forward block 71 is made higher in the logic synthesis process.

This case needs more detailed wiring processing such as inserting a repeater into the net 80 in the layout process. When this layout process doesn't result in satisfying the constraint, the floor plan is recomposed again.

The conventional technique, however, has the following problems.

As a first problem, a delay constraint effective in every block cannot be automatically given to a path across the blocks. This is because according as the delay not to be optimized becomes greater, vaguer logic synthesis delay constraint is distributed to the forward block which supplies a signal to the same delay not to be optimized.

As a second problem, only making the driving potential of the output gate higher is not enough to reduce the wiring delay of the net, but modification in the layout process and return to the floor planning process may frequently happen. This is because the driving potential of the output gate is limited, and when the wiring length of a net across blocks is very long, it becomes short of the driving potential.

SUMMARY OF THE INVENTION

An object of the present invention is to provide a constraint generating device for logic synthesis and its constraint generating method capable of downsizing and speeding up a circuit to be optimized.

Another object of the present invention is to provide a constraint generating device for logic synthesis and its constraint generating method improved in efficiency by reducing the number of processes in logical circuit design.

According to the first aspect of the invention, a logic synthesis constraint generating device for generating a delay constraint for a logical circuit having a hierarchical structure of blocks, comprises input means for receiving information of a logical circuit including the hierarchical structure divided by the block, an internal delay of each block, and a delay between the blocks, a delay distributing constraint of the logical circuit, and the target library information of the logical circuit, storing means for storing the received information of the logical circuit, delay distributing constraint of the logical circuit, and target library information of the logical circuit, timing analyzing means for performing a timing analysis on the information of the logical circuit and the delay distributing constraint of the logical circuit stored in the storing means, and delay constraint distributing means of, when distributing the delay distributing constraint of the logical circuit as a logic synthesis delay constraint, receiving the ratio of each delay at a lower hierarchy excepting the delay of a circuit to be optimized for logic synthesis, and distributing the value obtained by subtracting the delay of the circuit to be synthesized logically from a constraint of a path according to the ratio of the delay of the lower hierarchy to each hierarchy as the logic synthesis delay constraint.

In the preferred construction, the logic synthesis constraint generating device further comprises floor planning means for creating a floor plan of a logical circuit to be designed, and storing wiring delay information of a net between blocks and a delay between terminals within each block into a circuit delay information storing unit as well as storing connecting information of a net between blocks into a circuit connecting information storing unit.

In another preferred construction, the logic synthesis constraint generating device further comprises floor planning means for creating a floor plan of a logical circuit to be designed, and storing wiring delay information of a net between blocks and a delay between terminals within each block into the circuit delay information storing unit as well as storing connecting information of a net between blocks into the circuit connecting information storing unit, and logic synthesis processing means for performing a logic synthesis on a circuit stored in the circuit connecting information storing unit and the circuit delay information storing unit, by use of the logic synthesis delay constraint.

In another preferred construction, the logic synthesis constraint generating device further comprises floor planning means for creating a floor plan of a logical circuit to be designed, and storing wiring delay information of a net between blocks and a delay between terminals within each block into the circuit delay information storing unit as well as storing connecting information of a net between blocks into the circuit connecting information storing unit, the timing analyzing means performing a timing analysis on every path based on the constraint of the specification of the logical circuit, by use of the target library necessary for the timing analysis, upon receipt of the circuit connecting information of the logical circuit, and storing the analysis result into the circuit delay information storing unit.

In another preferred construction, the logic synthesis constraint generating device further comprises floor planning means for creating a floor plan of a logical circuit to be designed, and storing wiring delay information of a net between blocks and a delay between terminals within each block into the circuit delay information storing unit as well as storing connecting information of a net between blocks into the circuit connecting information storing unit, the timing analyzing means performing a timing analysis on every path based on the constraint of the specification of the logical circuit, by use of the target library necessary for the timing analysis, upon receipt of the circuit connecting information of the logical circuit, and storing the analysis result into the circuit delay information storing unit, the delay constraint distributing means generating a logic synthesis delay constraint for every block, based on the constraint of the specification of a logical circuit stored in a delay distributing constraint storing unit and the result of the timing analysis stored in the circuit delay information storing unit, and storing the logic synthesis delay constraint into a logic synthesis constraint storing unit.

According to the second aspect of the invention, a logic synthesis constraint generating method for generating a delay constraint for a logical circuit having a hierarchical structure of blocks, comprising an input step of receiving information of a logical circuit including the hierarchical structure divided by the block, an internal delay of each block, and a delay between the blocks, a delay distributing constraint of the logical circuit, and the target library information of the logical circuit;

a storing step of storing the received information of the logical circuit, delay distributing constraint of the logical circuit, and target library information of the logical circuit;

a timing analysis step of performing a timing analysis on the information of the logical circuit and the delay distributing constraint of the logical circuit stored in the storing step of circuit database; and a delay constraint distributing step of, when distributing the delay distributing constraint of the logical circuit as a logic synthesis delay constraint, receiving the ratio of each delay at a lower hierarchy excepting the delay of a circuit to be optimized for logic synthesis, and distributing the value obtained by subtracting the delay of the circuit to be synthesized logically from a constraint of a path according to the ratio of the delay of the lower hierarchy to each hierarchy as the logic synthesis delay constraint.

In the preferred construction, the logic synthesis constraint generating method further comprising a floor planning step of creating a floor plan of a logical circuit to be designed, and storing wiring delay information of a net between blocks and a delay between terminals within each block into a circuit delay information storing unit as well as storing connecting information of a net between blocks into a circuit connecting information storing unit.

In another preferred construction, the logic synthesis constraint generating method further comprising a floor planning means of creating a floor plan of a logical circuit to be designed, and storing wiring delay information of a net between blocks and a delay between terminals within each block into the circuit delay information storing unit as well as storing connecting information of a net between blocks into the circuit connecting information storing unit, and a logic synthesis step of performing a logic synthesis on a circuit stored in the circuit connecting information storing unit and the circuit delay information storing unit, by use of the logic synthesis delay constraint.

In another preferred construction, the logic synthesis constraint generating method further comprising a floor planning step of creating a floor plan of a logical circuit to be designed, and storing wiring delay information of a net between blocks and a delay between terminals within each block into the circuit delay information storing unit as well as storing connecting information of a net between blocks into the circuit connecting information storing unit, the timing analysis step further including a step of performing a timing analysis on every path based on the constraint of the specification of the logical circuit, by use of the target library necessary for the timing analysis, upon receipt of the circuit connecting information of the logical circuit, and storing the analysis result into the circuit delay information storing unit.

In another preferred construction, the logic synthesis constraint generating method further comprising a floor planning step of creating a floor plan of a logical circuit to be designed, and storing wiring delay information of a net between blocks and a delay between terminals within each block into the circuit delay information storing unit as well as storing connecting information of a net between blocks into the circuit connecting information storing unit, the timing analysis step further including a step of performing a timing analysis on every path based on the constraint of the specification of the logical circuit, by use of the target library necessary for the timing analysis, upon receipt of the circuit connecting information of the logical circuit, and storing the analysis result into the circuit delay information storing unit, the delay constraint distributing step further including a step of generating a logic synthesis delay constraint for every block, based on the constraint of the specification of a logical circuit stored in a delay distributing constraint storing unit and the result of the timing analysis stored in the circuit delay information storing unit, and storing the logic synthesis delay constraint into a logic synthesis constraint storing unit.

According to the third aspect of the invention, a computer readable memory storing a logic synthesis constraint generating program for generating a delay constraint for a logical circuit having a hierarchical structure of blocks, the constraint generating program comprising an input step of receiving information of a logical circuit including the hierarchical structure divided by the block, an internal delay of each block, and a delay between the blocks, a delay distributing constraint of the logical circuit, and the target library information of the logical circuit, a storing step of storing the received information of the logical circuit, delay distributing constraint of the logical circuit, and target library information of the logical circuit, a timing analysis step of performing a timing analysis on the information of the logical circuit and the delay distributing constraint of the logical circuit stored in the storing step of circuit database; and a delay constraint distributing step of, when distributing the delay distributing constraint of the logical circuit as a logic synthesis delay constraint, receiving the ratio of each delay at a lower hierarchy excepting the delay of a circuit to be optimized for logic synthesis, and distributing the value obtained by subtracting the delay of the circuit to be synthesized logically from a constraint of a path according to the ratio of the delay of the lower hierarchy to each hierarchy as the logic synthesis delay constraint.

According to another aspect of the invention, a logic synthesis constraint generating device for generating a delay constraint for a logical circuit having a hierarchical structure of blocks, comprises input unit which receives information of a logical circuit including the hierarchical structure divided by the block, an internal delay of each block, and a delay between the blocks, a delay distributing constraint of the logical circuit, and the target library information of the logical circuit, storage which stores the received information of the logical circuit, delay distributing constraint of the logical circuit, and target library information of the logical circuit, timing analyzing unit which performs a timing analysis on the information of the logical circuit and the delay distributing constraint of the logical circuit stored in the storage, and delay constraint distributing unit, when distributing the delay distributing constraint of the logical circuit as a logic synthesis delay constraint, which receives the ratio of each delay at a lower hierarchy excepting the delay of a circuit to be optimized for logic synthesis, and distributes the value obtained by subtracting the delay of the circuit to be synthesized logically from a constraint of a path according to the ratio of the delay of the lower hierarchy to each hierarchy as the logic synthesis delay constraint.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

A logic synthesis constraint generating device and its constraint generating method according to an embodiment of the present invention is characterized by automatically distributing a logic synthesis delay constraint for use in the logic synthesis in the delay constraint distributing process, with a delay (fixed value) depending on the wiring length of a net excluded from a delay to be optimized.

Namely, by distributing a delay distributing constraint excepting a delay not to be optimized, a delay constraint for logic synthesis can be divided to each block on a path by the proper ratio of every block. This can reduce the burden of the logic synthesis, and a repeater can be inserted into a circuit having a very long net in the floor planning process. As a result, it is effective in preventing from return to process. Hereinafter, the present invention will be described in detail by reference to the drawings.

Figure 1:
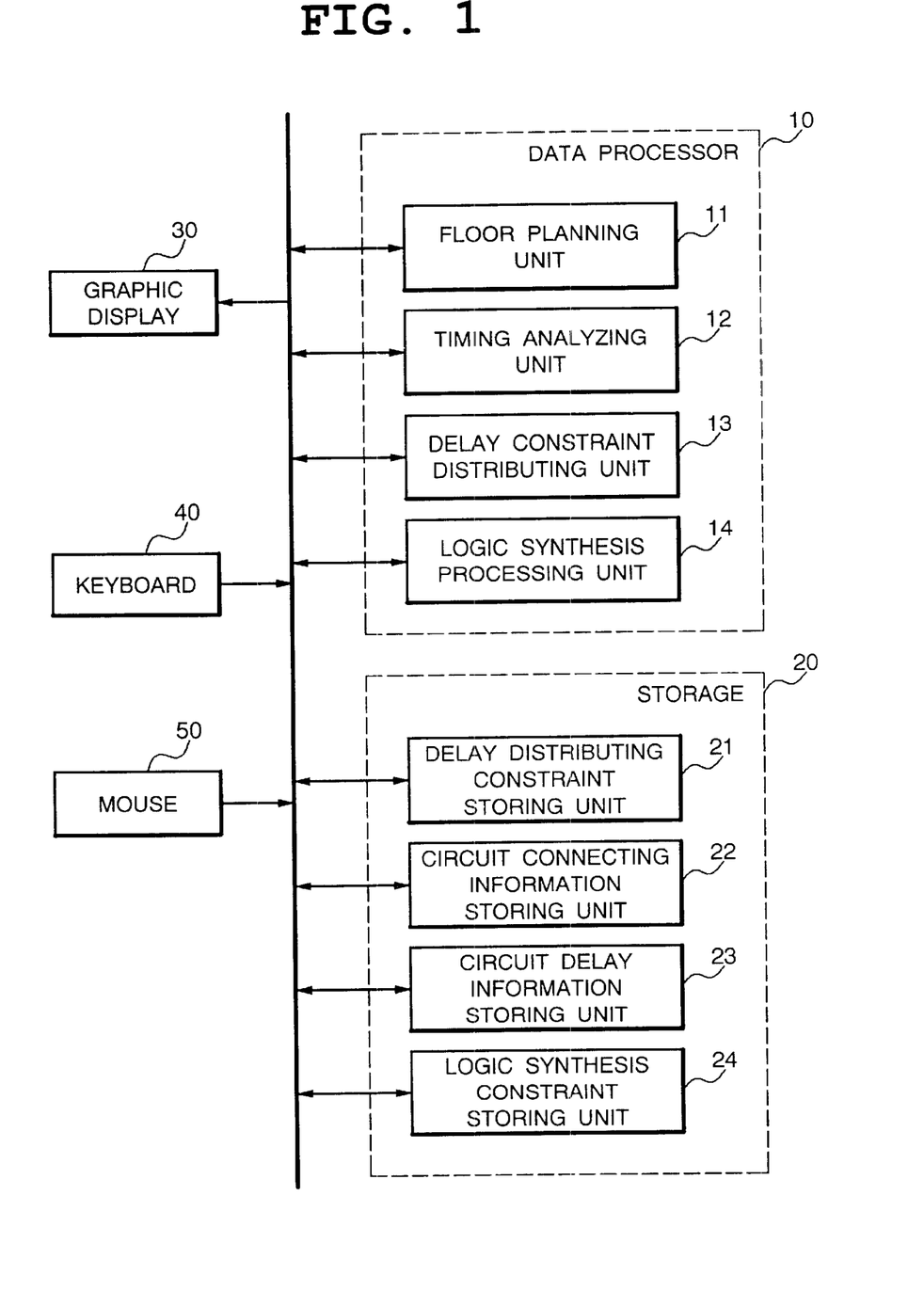
FIG. 1 is a block diagram of functions for use in describing an embodiment of a logic synthesis constraint generating device according to the present invention.

FIG. 1 is a block diagram of functions for use in describing an embodiment of a logic synthesis constraint generating device according to the present invention. Referring to FIG. 1, the logic synthesis constraint generating device of the present embodiment with a delay not to be optimized for logic synthesis taken into consideration, roughly speaking, comprises a data processor 10, a storage 20, a graphic display (output unit) 30, a keyboard (an input unit of hierarchical circuit specification, a constraint input unit, a library input unit) 40, and a mouse (an input unit of hierarchical circuit specification, a constraint input unit, a library input unit) 50.

The data processor 10 includes a floor planning unit 11, a timing analyzing unit (timing analyzer) 12, a delay constraint distributing unit 13, and a logic synthesis processing unit 14. The storage 20 includes a delay distributing constraint storing unit 21, a circuit connecting information storing unit 22, a circuit delay information storing unit 23, and a logic synthesis constraint storing unit 24.

The keyboard 40 and the mouse 50 enter the information of a logical circuit including a hierarchical structure divided by the block and an internal delay of the block and a delay between the blocks, and a delay distributing constraint for a logical circuit. Further, the keyboard 40 and the mouse 50 also enter the information of a target library of a logical circuit.

These entered information of a logical circuit, delay distributing constraint and target library information are stored in the storage 20.

The data processor 10 may be realized by various programs running on a central processing unit that forms, for example, EWS (Engineering Work Station: a kind of a work station). The storage (a circuit database unit, a library database unit) 20 is formed by an auxiliary storage or a main storage of EWS.

The floor planning unit 11 has a function of creating a floor plan of a logical circuit having a hierarchical structure of blocks that is to be designed by a designer, according to the operation of the keyboard 40 and the mouse 50 on a screen of the graphic display 30, and storing a wiring delay of a net between blocks and a delay between terminals within the block into the circuit delay information storing unit 23 as well as storing the connecting information of a net between blocks into the circuit connecting information storing unit 22.

The floor planning unit 11 also has a function of inserting a repeater at a position where the wiring length of a net between blocks is long. Since a circuit is already designed or the structure of a circuitry is not changed, it has a function of inserting a macro or a gate which requires no generation of a logic synthesis delay constraint, or where the delay has been already decided.

Upon receipt of the circuit connecting information stored in the circuit connecting information storing unit 22, the timing analyzing unit 12 has a function of analyzing the timing as for ever path, based on the constraint of the specification of a logical circuit stored in the delay distributing constraint storing unit 21, by use of the target library having the information of technology necessary for the timing analysis, and storing the analysis result into the circuit delay information storing unit 23.

The delay constraint distributing unit 13 has a function of generating a logic synthesis delay constraint for every block and storing the same into the logic synthesis constraint storing unit 24, based on the constraint of the specification of a logical circuit stored in the delay distributing constraint storing unit 21 and the result of the timing analysis stored in the circuit delay information storing unit 23.

The logic synthesis processing unit 14 has a function of performing the logic synthesis on a circuit stored in the circuit connecting information storing unit 22 and the circuit delay information storing unit 23, by use of the logic synthesis delay constraint stored in the logic synthesis constraint storing unit 24.

The delay and the connecting information of blocks in a circuit or between blocks are respectively stored in the circuit delay information storing unit 23 and the circuit connecting information storing unit 22. Only if the connecting information and the delay can be understood, a model simplified without unnecessary logical information can be used, as for the information stored in the circuit connecting information storing unit 22 and the circuit delay information storing unit 23.

This time, the delay distributing process of the embodiment will be described with reference to FIGS. 2 to 4.

Figure 2:
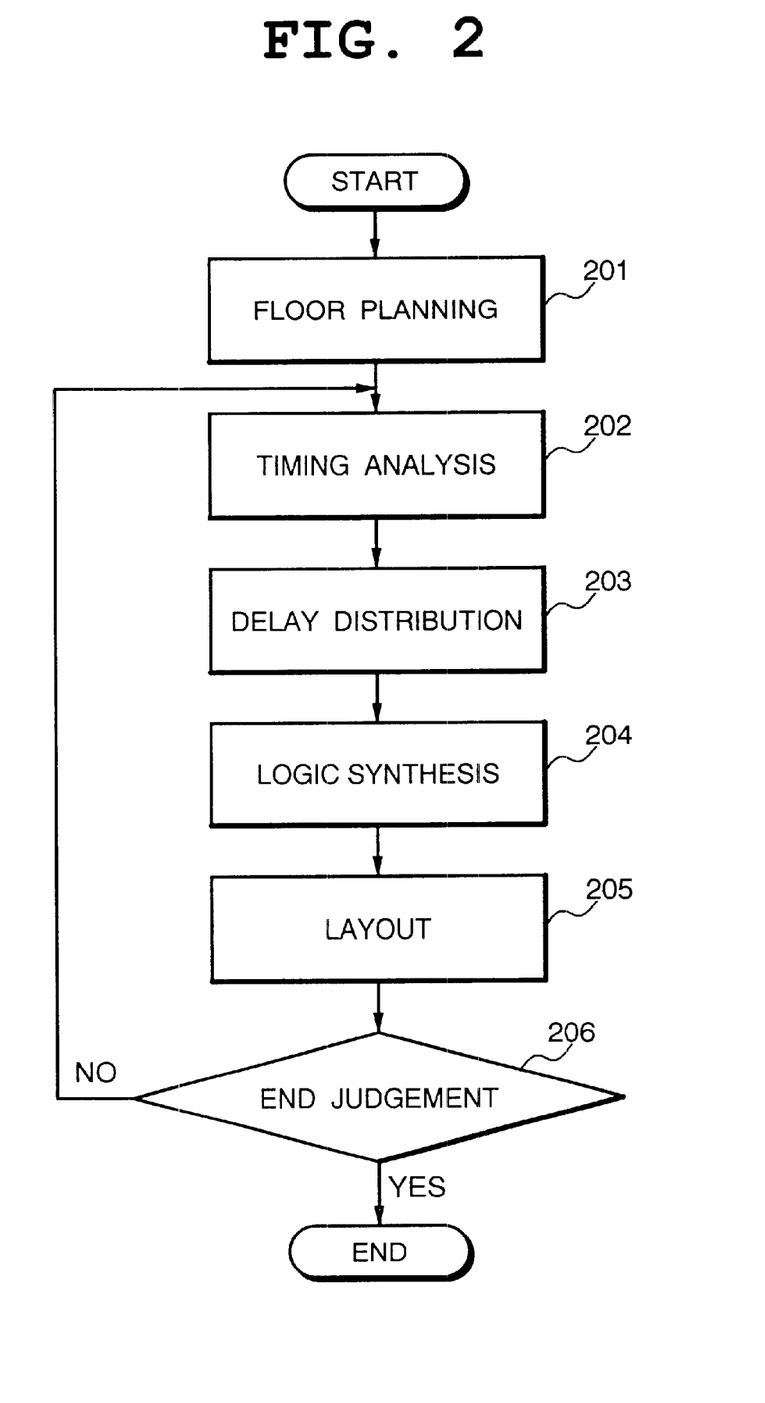
FIG. 2 is a flow chart for use in describing an embodiment of logic synthesis constraint generation in a logic synthesis constraint generating method according to the present invention.
Figure 4:
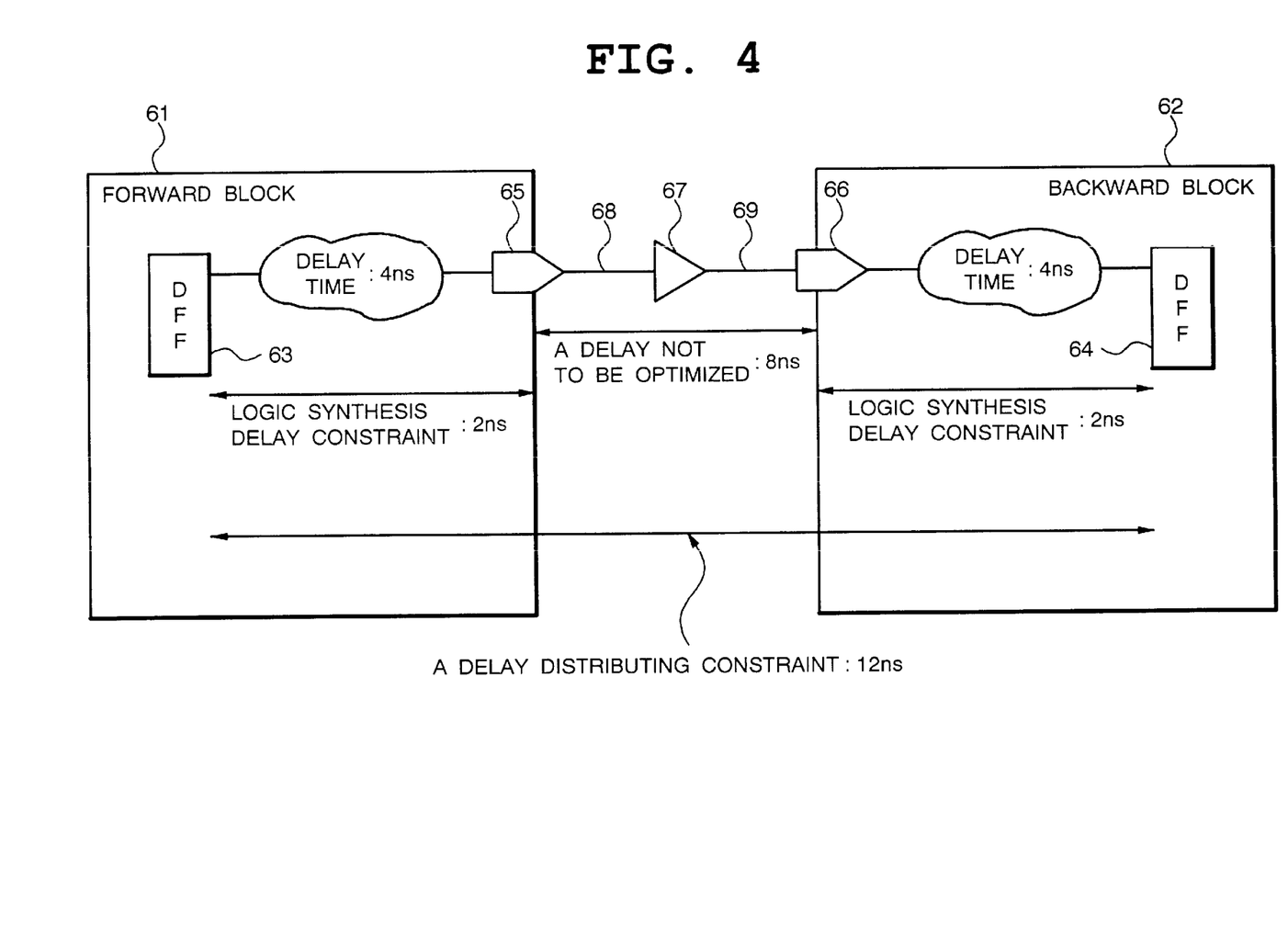
FIG. 4 is a view for use in describing an embodiment of distributing process of a logic synthesis delay constraint in the logic synthesis constraint generating method according to the present invention.

FIG. 2 is a flow chart for use in describing an embodiment of the logic synthesis constraint generation in the logic synthesis constraint generating method according to the present invention, and FIG. 4 is a view for use in describing an embodiment of the distributing process of a logic synthesis delay constraint in the logic synthesis constraint generating method according to the present invention.

Hereinafter, the description will be made in the case (refer to FIG. 4.) where there is a path going from the DFF 63 (a flip flop circuit) within the forward block 61 to the DFF 64 within the backward block 62 through the nets 68 and 69 that are of a delay not to be optimized and where the logic synthesis delay constraint is generated according to the present invention when the clock cycle for driving the DFF 63 and the DFF 64 subjected to the delay distributing constraint of a path is 12 ns.

When the logic synthesis constraint generation starts according to the logic synthesis constraint generating method, a repeater 67 is inserted in the floor planning process (Step 201), because the wiring length between the forward block 61 and the backward block 62 is long.

The delay not to be optimized includes the delay of a macro, the delay of the gate circuit, and the delay of the repeater 67 inserted in the floor planning process (Step 201), other than the delay of the nets 68 and 69. The delay not to be optimized and the circuit to be optimized may be arbitrarily specified by a designer.

Such a logic synthesis delay constraint is generated that the output gate 65 has enough driving potential to drive the net 68 connected to the output gate 65 and the first circuit (for example, the repeater 67 in FIG. 4) connected to the net 68, and the same constraint is stored in the logic synthesis constraint storing unit 24.

A constraint for driving a circuit not to be optimized which is extended from the repeater 67 (for example, the net 69 shown in FIG. 4) is not considered in the output gate 65. The delay in the forward block 61 doesn't include the delay not to be optimized outside of the output gate 65 (for example, the delay of the net 68, the delay of the net 69, and the delay of the repeater 67).

In the timing analyzing process (Step 202), the timing analysis is performed according to the constraint of the whole circuit entered from the delay distributing constraint storing unit 21.

In the delay constraint distributing process (Step 203), the ratio of the delay of each block excepting the delay of the circuit to be optimized for logic synthesis is required, and according to the above ratio, the value obtained by subtracting the delay of the circuit not to be optimized for logic synthesis from the constraint of the path is divided in every block as the logic synthesis delay constraint.

In the logic synthesis process (Step 204), logic synthesis is performed on a circuit stored in the circuit connecting information storing unit 22 and the circuit delay information storing unit 23, by use of the logic synthesis delay constraint stored in the logic synthesis constraint storing unit 24.

In the layout process (Step 205), the detailed wiring is performed based on the result of the logic synthesis process (Step 204).

In the end judging process (Step 206), it is judged whether the result of the layout process (Step 205) satisfies the constraint stored in the delay distributing constraint storing unit 21. If it does not satisfy the constraint, the process will be returned backward.

In this embodiment, the process is returned to the step after the floor planning process (Step 201); however, depending on the situation, it may be returned to the other step.

The whole process or some of the processes of the flow chart of the present invention will be repeated in every hierarchy as for a hierarchically designed circuit, if a delay constraint is necessary in every hierarchy.

Figure 3:
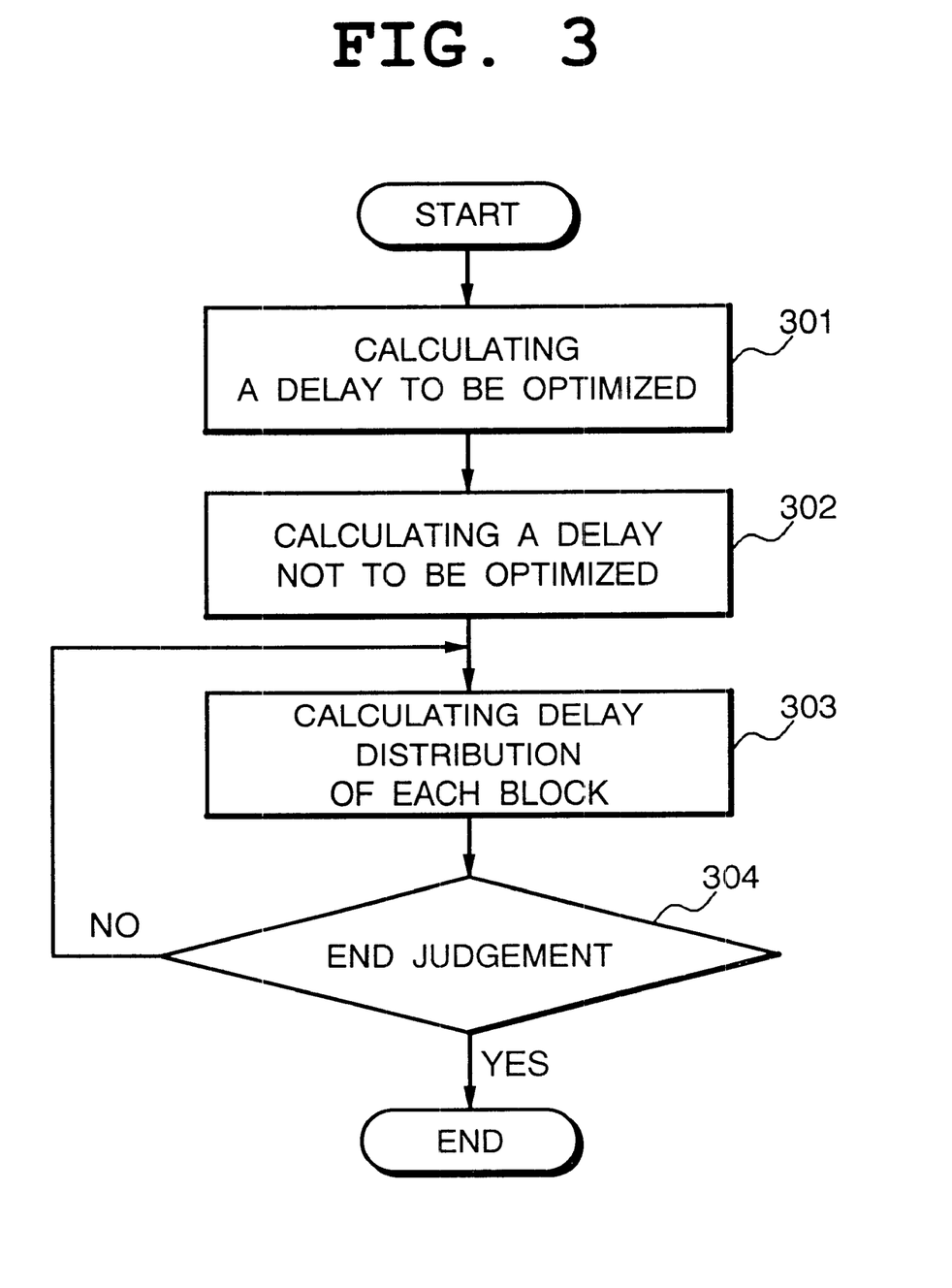
FIG. 3 is a flow chart for use in describing an embodiment of delay distributing process for logic synthesis in the logic synthesis constraint generating method according to the present invention.

FIG. 3 is a flow chart for use in describing an embodiment of the logic synthesis delay distributing process in the logic synthesis constraint generating method according to the present invention, and FIG. 4 is a view for use in describing an embodiment of the distributing process of a logic synthesis delay constraint in the logic synthesis constraint generating method according to the present invention.

When the logic synthesis delay distributing process in the logic synthesis constraint generating method starts, the delay to be optimized is obtained by accumulating the delay of the circuit to be optimized on the path, in the optimized delay calculating process (Step 301).

In the not-optimized delay calculating process (Step 302), the delay not to be optimized is obtained by accumulating the delay of the circuit not to be optimized on the path. At this time, in the distributing process of the logic synthesis delay constraint in FIG. 4, if the total delay of the net 68, the net 69, and the repeater 67 that is the delay not to be optimized is 8 ns, the delay to be optimized that is capable of distributing to the both forward block 61 and backward block 62 becomes equal to the value obtained by subtracting the delay not to be optimized from the delay distributing constraint 12 ns of the path; 12−8=4 ns.

In the delay distribution calculating process (Step 303), the logic synthesis delay constraint to be distributed in every block is obtained. The ratio of distribution in every block is defined as the delay of the corresponding block/the delay to be optimized, and (the delay of the same block/the delay to be optimized)×the delay to be optimized is divided in every block as the logic synthesis delay constraint.

In the distribution process of the logic synthesis delay constraint in FIG. 4, the internal delay of the forward block 61 and the internal delay of the backward block 62 are both 4 ns, and the delay to be optimized is respectively distributed to the forward block 61 and the backward block 62 by the ratio of the delay of each block.

Namely, in the distributing process of the logic synthesis delay constraint, (4/8)×4 ns is respectively distributed to the forward block 61 and the backward block 62; as a result, 2 ns is distributed to the forward block 61 as the logic synthesis delay constraint, and 2 ns is distributed to the backward block 62 as the logic synthesis delay constraint.

In the distributing process of the logic synthesis delay constraint in FIG. 4, two blocks exist on the path; however, when more than two blocks exist on the path, the delay to be optimized obtained by subtracting the delay not to be optimized from the delay distributing constraint of the path is distributed to every block according to the ratio of the delay of every block, similarly in the case of two blocks.

In the embodiment, when a plurality of logic synthesis delay constraints may be considered since a path is branched or converged in connection of a block and an external input/output terminal of a block in a circuit, a designer can specify the method of selecting the logic synthesis delay constraint depending on the situation of the design. For example, he or she can specify the selecting method such as adopting the logic synthesis delay constraint of the most critical path, or adopting the most critical logic synthesis delay constraint in every block that is the logic synthesis unit.

In the end judging process (Step 304), it is judged whether distribution of the logic synthesis delay constraint has been completed in every block; if it has not been completed (NO in Step 304), the logic synthesis constraint is distributed to a block to which it has not been not distributed. The distributed logic synthesis delay constraint is stored in the logic synthesis constraint storing unit 24.

The logic synthesis delay constraint is divided by the logic synthesis unit, for example, in every block, and supplied thereto. When the delay not to be optimized is too large to do the logic synthesis (for example, when the wiring length of the nets 68 and 69 is longer than the clock cycle or it is as long as the clock cycle), the warning information to that effect is supplied, instructing a designer to review the floor plan and the circuit specification.

As mentioned above, the present invention enables the generation of a logic synthesis delay constraint with the delay not to be optimized taken into consideration.

As set forth hereinabove, at first, the present invention enables the logic synthesis suitable for the performance, and it is capable of reducing the number of returns to the backward process in the logical circuit design as many as possible. This is because distributing the logic synthesis delay constraint with the delay not to be optimized taken into consideration can estimate the final installation form more accurately than in the conventional method. At second, the present invention is capable of taking measures against the case where the logic synthesis of a path is difficult, by inserting a repeater in the floor planning process (Step 201) before the logic synthesis. This is because the present invention can deal with a circuit having a logic synthesis not-required circuit such as a repeater or a macro inserted in the floor planning process (Step 201), thereby to estimate the possibility of the logic synthesis earlier.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A logic synthesis constraint generating device for generating a delay constraint for a logical circuit having a hierarchical structure of blocks, comprising:

input means for receiving information describing features of a logical circuit including a hierarchical structure of blocks of the logical circuit, an internal delay of each block, and a delay between each of the blocks, and for receiving a delay distributing constraint of the logical circuit, and target library information of the logical circuit;

storing means for storing the received information, the delay distributing constraint, and the target library information;

timing analyzing means for performing a timing analysis using the information describing the features of the logical circuit and the delay distributing constraint of the logical circuit; and delay constraint distributing means for distributing the delay distributing constraint of the logical circuit as logic synthesis delay constraints among the blocks of the logical circuit by subtracting a delay not to be optimized of the circuit from the delay distributing constraint and distributing a remaining amount of the delay distributing constraint to the blocks of the logical circuit in proportion to their respective internal delays.

2. A logic synthesis constraint generating device as set forth in claim 1, further comprising:

floor planning means for creating a floor plan of a logical circuit to be designed, and storing wiring delay information of a net between blocks and a delay between terminals within each block into a circuit delay information storing unit as well as storing connecting information of a net between blocks into a circuit connecting information storing unit.

3. A logic synthesis constraint generating device as set forth in claim 1, further comprising:

floor planning means for creating a floor plan of a logical circuit to be designed, and storing wiring delay information of a net between blocks and a delay between terminals within each block into the circuit delay information storing unit as well as storing connecting information of a net between blocks into the circuit connecting information storing unit, and logic synthesis processing means for performing a logic synthesis on a circuit stored in the circuit connecting information storing unit and the circuit delay information storing unit, by use of the logic synthesis delay constraint.

4. A logic synthesis constraint generating device as set forth in claim 1, further comprising:

floor planning means for creating a floor plan of a logical circuit to be designed, and storing wiring delay information of a net between blocks and a delay between terminals within each block into the circuit delay information storing unit as well as storing connecting information of a net between blocks into the circuit connecting information storing unit, said timing analyzing means performing a timing analysis on every path based on the constraint of the specification of the logical circuit, by use of the target library necessary for the timing analysis, upon receipt of the circuit connecting information of the logical circuit, and storing the analysis result into the circuit delay information storing unit.

5. A logic synthesis constraint generating device as set forth in claim 1, further comprising:

floor planning means for creating a floor plan of a logical circuit to be designed, and storing wiring delay information of a net between blocks and a delay between terminals within each block into the circuit delay information storing unit as well as storing connecting information of a net between blocks into the circuit connecting information storing unit, said timing analyzing means performing a timing analysis on every path based on the constraint of the specification of the logical circuit, by use of the target library necessary for the timing analysis, upon receipt of the circuit connecting information of the logical circuit, and storing the analysis result into the circuit delay information storing unit, said delay constraint distributing means generating a logic synthesis delay constraint for every block, based on the constraint of the specification of a logical circuit stored in a delay distributing constraint storing unit and the result of the timing analysis stored in the circuit delay information storing unit, and storing the logic synthesis delay constraint into a logic synthesis constraint storing unit.

6. A logic synthesis constraint generating method for generating a delay constraint for a logical circuit having a hierarchical structure of blocks, comprising:

receiving information describing features of a logical circuit including a hierarchical structure of blocks of the logical circuit, an internal delay of each block, and a delay between each of the blocks, and for receiving a delay distributing constraint of the logical circuit, and target library information of the logical circuit;

of storing the received information, the delay distributing constraint, and the target library information;

performing a timing analysis using the information describing the features of the logical circuit and the delay distributing constraint of the logical circuit; and distributing the delay distributing constraint of the logical circuit as logic synthesis delay constraints among the blocks of the logical circuit by subtracting a delay not to be optimized of the circuit from the delay distributing constraint and distributing a remaining amount of the delay distributing constraint to the blocks of the logical circuit in proportion to their respective internal delays.

7. A logic synthesis constraint generating method as set forth in claim 6, further comprising:

creating a floor plan of a logical circuit to be designed, and storing wiring delay information of a net between blocks and a delay between terminals within each block into a circuit delay information storing unit as well as storing connecting information of a net between blocks into a circuit connecting information storing unit.

8. A logic synthesis constraint generating method as set forth in claim 6, further comprising:

creating a floor plan of a logical circuit to be designed, and storing wiring delay information of a net between blocks and a delay between terminals within each block into the circuit delay information storing unit as well as storing connecting information of a net between blocks into the circuit connecting information storing unit, and performing a logic synthesis on a circuit stored in the circuit connecting information storing unit and the circuit delay information storing unit, by use of the logic synthesis delay constraint.

9. A logic synthesis constraint generating method as set forth in claim 6, further comprising:

creating a floor plan of a logical circuit to be designed, and storing wiring delay information of a net between blocks and a delay between terminals within each block into the circuit delay information storing unit as well as storing connecting information of a net between blocks into the circuit connecting information storing unit, and wherein performing said timing analysis comprises performing a timing analysis on every path based on the constraint of the specification of the logical circuit, by use of the target library necessary for the timing analysis, union receipt of the circuit connecting information of the logical circuit, and storing the analysis result into the circuit delay information storing unit.

10. A logic synthesis constraint generating method as set forth in claim 6, further comprising:

a floor planning step of creating a floor plan of a logical circuit to be designed, and storing wiring delay information of a net between blocks and a delay between terminals within each block into the circuit delay information storing unit as well as storing connecting information of a net between blocks into the circuit connecting information storing unit, said timing analysis step further including a step of performing a timing analysis on every path based on the constraint of the specification of the logical circuit, by use of the target library necessary for the timing analysis, upon receipt of the circuit connecting information of the logical circuit, and storing the analysis result into the circuit delay information storing unit, said delay constraint distributing step further including a step of generating a logic synthesis delay constraint for every block, based on the constraint of the specification of a logical circuit stored in a delay distributing constraint storing unit and the result of the timing analysis stored in the circuit delay information storing unit, and storing the logic synthesis delay constraint into a logic synthesis constraint storing unit.

11. A computer readable memory storing a logic synthesis constraint generating program for generating a delay constraint for a logical circuit having a hierarchical structure of blocks, the constraint generating program comprising:

receiving information describing features of a logical circuit including a hierarchical structure of blocks of the logical circuit, an internal delay of each block, and a delay between each of the blocks, and for receiving a delay distributing constraint of the logical circuit, and target library information of the logical circuit;

storing the received information, the delay distributing constraint, and the target library information;

performing a timing analysis using the information describing the features of the logical circuit and the delay distributing constraint of the logical circuit; and distributing the delay distributing constraint of the logical circuit as logic synthesis delay constraints among the blocks of the logical circuit by subtracting a delay not to be optimized of the circuit from the delay distributing constraint and distributing a remaining amount of the delay distributing constraint to the blocks of the logical circuit in proportion to their respective internal delays.

12. A computer readable memory as set forth in claim 11, in which the constraint generating program further comprises:

creating a floor plan of a logical circuit to be designed, and storing wiring delay information of a net between blocks and a delay between terminals within each block into a circuit delay information storing unit as well as storing connecting information of a net between blocks into a circuit connecting information storing unit.

13. A computer readable memory as set forth in claim 11, in which the constraint generating program further comprises:

creating a floor plan of a logical circuit to be designed, and storing wiring delay information of a net between blocks and a delay between terminals within each block into the circuit delay information storing unit as well as storing connecting information of a net between blocks into the circuit connecting information storing unit, and performing a logic synthesis on a circuit stored in the circuit connecting information storing unit and the circuit delay information storing unit, by use of the logical synthesis delay constraint.

14. A computer readable memory as set forth in claim 11, in which the constraint generating program further comprises:

creating a floor plan of a logical circuit to be designed, and storing wiring delay information of a net between blocks and a delay between terminals within each block into the circuit delay information storing unit as well as storing connecting information of a net between blocks into the circuit connecting information storing unit, and wherein performing said timing analysis comprises performing a timing analysis on every path based on the constraint of the specification of the logical circuit, by use of the target library necessary for the timing analysis, upon receipt of the circuit connecting information of the logical circuit, and storing the analysis result into the circuit delay information storing unit.

15. A computer readable memory as set forth in claim 11, in which the constraint generating program further comprises:

creating a floor plan of a logical circuit to be designed, and storing wiring delay information of a net between blocks and a delay between terminals within each block into the circuit delay information storing unit as well as storing connecting information of a net between blocks into the circuit connecting information storing unit, and wherein performing said timing analysis comprises performing a timing analysis on every path based on the constraint of the specification of the logical circuit, by use of the target library necessary for the timing analysis, upon receipt of the circuit connecting information of the logical circuit, and storing the analysis result into the circuit delay information storing unit, and wherein distributing said delay distributing constraint comprises generating a logic synthesis delay constraint for every block, based on the constraint of the specification of a logical circuit stored in a delay distributing constraint storing unit and the result of the timing analysis stored in the circuit delay information storing unit, and storing the logic synthesis delay constraint into a logic synthesis constraint storing unit.

16. A logic synthesis constraint generating device for generating a delay constraint for a logical circuit having a hierarchical structure of blocks, comprising:

an input unit which receives information describing features of a logical circuit including a hierarchical structure of blocks of the logical circuit, an internal delay of each block, and a delay between each of the blocks, and which receives a delay distributing constraint of the logical circuit, and target library information of the logical circuit;

a storage which stores the received information, the delay distributing constraint, and the target library information;

a timing analyzing unit which performs a timing analysis using the information describing the features of the logical circuit and the delay distributing constraint of the logical circuit stored in said storage; and a delay constraint distributing unit for distributing the delay distributing constraint of the logical circuit as logic synthesis delay constraints among the blocks of the logical circuit by subtracting a delay not to be optimized of the circuit from the delay distributing constraint and distributing a remaining amount of the delay distributing constraint to the blocks of the logical circuit in proportion to their respective internal delays.

17. A logic synthesis constraint generating device as set forth in claim 16, further comprising:

floor planning unit which creates a floor plan of a logical circuit to be designed, and stores wiring delay information of a net between blocks and a delay between terminals within each block into a circuit delay information storing unit as well as storing connecting information of a net between blocks into a circuit connecting information storing unit.

18. A logic synthesis constraint generating device as set forth in claim 16, further comprising:

floor planning unit which creates a floor plan of a logical circuit to be designed, and stores wiring delay information of a net between blocks and a delay between terminals within each block into the circuit delay information storing unit as well as storing connecting information of a net between blocks into the circuit connecting information storing unit, and logic synthesis processing unit which performs a logic synthesis on a circuit stored in the circuit connecting information storing unit and the circuit delay information storing unit, by use of the logic synthesis delay constraint.

19. A logic synthesis constraint generating device as set forth in claim 16, further comprising:

floor planning unit which creates a floor plan of a logical circuit to be designed, and stores wiring delay information of a net between blocks and a delay between terminals within each block into the circuit delay information storing unit as well as storing connecting information of a net between blocks into the circuit connecting information storing unit, said timing analyzing unit performs a timing analysis on every path based on the constraint of the specification of the logical circuit, by use of the target library necessary for the timing analysis, upon receipt of the circuit connecting information of the logical circuit, and stores the analysis result into the circuit delay information storing unit.

20. A logic synthesis constraint generating device as set forth in claim 16, further comprising:

floor planning unit which creates a floor plan of a logical circuit to be designed, and stores wiring delay information of a net between blocks and a delay between terminals within each block into the circuit delay information storing unit as well as storing connecting information of a net between blocks into the circuit connecting information storing unit, said timing analyzing unit performs a timing analysis on every path based on the constraint of the specification of the logical circuit, by use of the target library necessary for the timing analysis, upon receipt of the circuit connecting information of the logical circuit, and stores the analysis result into the circuit delay information storing unit, said delay constraint distributing unit generates a logic synthesis delay constraint for every block, based on the constraint of the specification of a logical circuit stored in a delay distributing constraint storing unit and the result of the timing analysis stored in the circuit delay information storing unit, and stores the logic synthesis delay constraint into a logic synthesis constraint storing unit.

* * * * *